(12) United States Patent
Koyama et al.

(10) Patent No.: US 9,391,428 B2
(45) Date of Patent: Jul. 12, 2016

(54) WAVEGUIDE ELEMENT

(71) Applicant: CANON KABUSHIKI KAISHA, Tokyo (JP)

(72) Inventors: Yasushi Koyama, Kamakura (JP); Yoshinori Tateishi, Naka-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/768,375

(22) PCT Filed: Mar. 6, 2014

(86) PCT No.: PCT/JP2014/056590
§ 371 (c)(1),
(2) Date: Aug. 17, 2015

(87) PCT Pub. No.: WO2014/148343
PCT Pub. Date: Sep. 25, 2014

(65) Prior Publication Data
US 2016/0006215 A1     Jan. 7, 2016

(30) Foreign Application Priority Data

Mar. 16, 2013 (JP) ................................. 2013-054449
Jan. 17, 2014 (JP) ................................. 2014-006359

(51) Int. Cl.
*H01S 5/00*     (2006.01)
*H01S 5/20*     (2006.01)
(Continued)

(52) U.S. Cl.
CPC ............ *H01S 5/2031* (2013.01); *G02B 6/1226* (2013.01); *H01P 3/121* (2013.01); *H01Q 9/045* (2013.01); *H01S 5/1028* (2013.01); *H01S 5/34* (2013.01)

(58) Field of Classification Search
CPC ..... H01S 5/1028; H01S 5/2031; H01Q 9/045; G02B 6/1226; H01P 3/121
USPC ........................................ 372/45.01; 324/639
See application file for complete search history.

(56) References Cited

U.S. PATENT DOCUMENTS 7,924,107 B2    4/2011    Koyama et al.
8,213,476 B1    7/2012    Wanke et al.
(Continued)

FOREIGN PATENT DOCUMENTS

EP     2175308 A1    4/2010
JP     H-07240621 A    9/1995
(Continued)

OTHER PUBLICATIONS

B. Williams, et al., "Terahertz quantum-cascade laser at λ • 100 μm using metal waveguide for mode confinement", Appl. Phys. Letters, vol. 83, No. 11, Sep. 15, 2003, pp. 2124-2126.
(Continued)

*Primary Examiner* — Tuan Nguyen
(74) *Attorney, Agent, or Firm* — Fitzpatrick, Cella, Harper & Scinto

(57) ABSTRACT

Provided is a waveguide element, including: a waveguide for guiding an electromagnetic wave; a resonance antenna for radiating or receiving the electromagnetic wave, the resonance antenna being arranged at a part of the waveguide for radiating or receiving the electromagnetic wave; and an impedance matching portion for matching an impedance of the waveguide with an impedance of the resonance antenna so as to couple the waveguide to the resonance antenna. The waveguide includes: a first conductor layer and a second conductor layer each having a negative dielectric constant real part for the electromagnetic wave; and a core layer arranged between the first conductor layer and the second conductor layer. The core layer has one of a gain of the electromagnetic wave and nonlinearity of carriers for the electromagnetic wave.

22 Claims, 9 Drawing Sheets

(51) Int. Cl.
*H01P 3/12* (2006.01)
*G02B 6/122* (2006.01)
*H01Q 9/04* (2006.01)
*H01S 5/10* (2006.01)
*H01S 5/34* (2006.01)

(56) References Cited

U.S. PATENT DOCUMENTS

| | | | |
|---|---|---|---|
| 8,896,389 | B2 | 11/2014 | Koyama et al. |
| 9,184,697 | B2 | 11/2015 | Sekiguchi et al. |
| 2003/0206708 | A1* | 11/2003 | Estes ................. B82Y 20/00 385/130 |
| 2013/0063159 | A1* | 3/2013 | Koyama ............... G02B 6/1226 324/639 |
| 2015/0303559 | A1 | 10/2015 | Tateishi |

FOREIGN PATENT DOCUMENTS

| | | |
|---|---|---|
| JP | 2006-033362 A | 2/2006 |
| JP | 2010-510703 A | 4/2010 |
| WO | 2008/075795 A1 | 6/2008 |
| WO | 2011/027671 A1 | 3/2011 |

OTHER PUBLICATIONS

A. Lee, et al., "High-power and high-temperature THz quantun-cascade lasers based on lens-coupled metal-metal waveguides", Optics Letters, vol. 32, No. 19, Oct. 1, 2007, pp. 2840-2842.
C. Walther, et al., "Quantum cascade lasers operating from 1.2 to 1.6 THz", Appl. Phys. Letters, vol. 91, Sep. 28, 2007, pp. 131122-1 to 131122-3.
International Search Report and Written Opinion of the International Searching Authority, mailed Jun. 23, 2014 in PCT/JP2014/056590.
International Preliminary Report on Patentability mailed Oct. 1, 22, 2015 in PCT/JP2014/056590.

* cited by examiner

WAVEGUIDE ELEMENT

TECHNICAL FIELD

The present invention relates to a waveguide element including a waveguide for guiding an electromagnetic wave. In particular, the present invention relates to an element for electromagnetic waves in frequency regions from a millimeter wave band to a terahertz wave band (30 GHz to 30 THz) (hereinafter also referred to as terahertz waves), such as an oscillation element and a detection element.

BACKGROUND ART

In the terahertz wave frequency region, there are absorption peaks of many organic molecules of biological materials, medicines, electronic materials, and the like stemming from the structures and states thereof. Further, the terahertz waves easily penetrate materials such as paper, ceramic, resin, and cloth. In recent years, research and development have been conducted on imaging technology and sensing technology which make use of such characteristics of terahertz waves. For example, application thereof to a safe fluoroscopic inspection apparatus to replace an X-ray apparatus, to an in-line non-destructive inspection apparatus in a manufacturing process, and the like is expected.

As a current injection type terahertz wave light source, studies are made on a structure which uses an electromagnetic wave gain based on intersubband transition of electrons in a semiconductor quantum well structure. Non Patent Literature 1 proposes a terahertz wave band quantum cascade laser (QCL) in which double-side metal waveguides (hereinafter also referred to as DMWs) which are known as low loss waveguides are integrated as resonators. This element attains laser oscillation around 3 THz by light confinement at a high level and low loss propagation due to causing terahertz waves that are emitted by stimulated emission to be guided in a surface plasmon mode to a resonator structure in which metal is placed above and below a gain medium formed of a semiconductor thin film at a thickness of about 10 μm.

CITATION LIST

Patent Literature

PTL 1: Japanese Patent Application Laid-Open No. 2010-510703
PTL 2: U.S. Patent Application Publication No. 2003/0206708

Non Patent Literature

NPL 1: Appl. Phys. Lett. 83, 2124 (2003)
NPL 2: OPTICS LETTERS, VOL. 32, ISSUE 19, PP. 2840-2842 (2007)

SUMMARY OF INVENTION

Technical Problems

The DMW causes an increase of edge reflection or beam pattern divergence due to impedance mismatch between the waveguide and a space. Therefore, from viewpoint of application, there is a task of efficient use and handling of a beam. Concerning this, Non Patent Literature 2 proposes a method of improving extraction efficiency and directivity by disposing a silicon lens at an end of the waveguide, but this method has practical problems such that the structure is physically and mechanically unstable and an additional member is required. Therefore, Patent Literature 1 discloses an example in which a horn antenna is integrated. However, the structure can hardly be said to have sufficient physical and mechanical stability, and directivity of the electromagnetic wave may be tilted from an optical axis of the waveguide. Therefore, there is a room for improvement of frequency stability and handling of the electromagnetic wave. In addition, Patent Literature 2 discloses an example in which a wide band bow-tie antenna is arranged in the waveguide, but a problem of impedance mismatch between the antenna and the waveguide or a problem of directivity of a radiated or incident electromagnetic wave has not been solved.

Solution to Problems

In view of the problems described above, according to one embodiment of the present invention, there is provided a waveguide element, including: a waveguide for guiding an electromagnetic wave; a resonance antenna for radiating or receiving the electromagnetic wave, the resonance antenna being arranged at a part of the waveguide for radiating or receiving the electromagnetic wave; and an impedance matching portion for matching an impedance of the waveguide with an impedance of the resonance antenna so as to couple the waveguide to the resonance antenna, in which the waveguide includes: a first conductor layer and a second conductor layer each having a negative dielectric constant real part for the electromagnetic wave; and a core layer arranged between the first conductor layer and the second conductor layer, and in which the core layer has one of a gain of the electromagnetic wave and nonlinearity of carriers for the electromagnetic wave.

Further aspects of the present invention will become apparent from the following description of exemplary embodiments with reference to the attached drawings.

DESCRIPTION OF EMBODIMENTS

In the present invention, an impedance matching portion is provided for matching an impedance of a waveguide for guiding electromagnetic waves between a first conductor layer and a second conductor layer each having a negative dielectric constant real part with an impedance of a resonance antenna for radiating or receiving the electromagnetic wave, so as to couple the waveguide to the resonance antenna. The impedance matching portion serves to make input and output impedances of the waveguide and the resonance antenna to be close to each other, or serves to arrange, between the waveguide and the resonance antenna, a member or a structure having an impedance range between the impedances of the waveguide and the resonance antenna. In the present invention, this is referred to as matching between the impedance of the waveguide and the impedance of the resonance antenna, and hence the waveguide and the resonance antenna can be appropriately coupled to each other. Thus, compared to a case where the air having a characteristic impedance of approximately 377Ω and a plasmon waveguide having a characteristic impedance of 0.1 to a few tens Ω are directly coupled to each other, the outside and the waveguide are coupled to each other with a smaller impedance difference.

In the following, with reference to the drawings, embodiments and examples of an element according to the present invention are described.

Embodiment

Figure 1A:
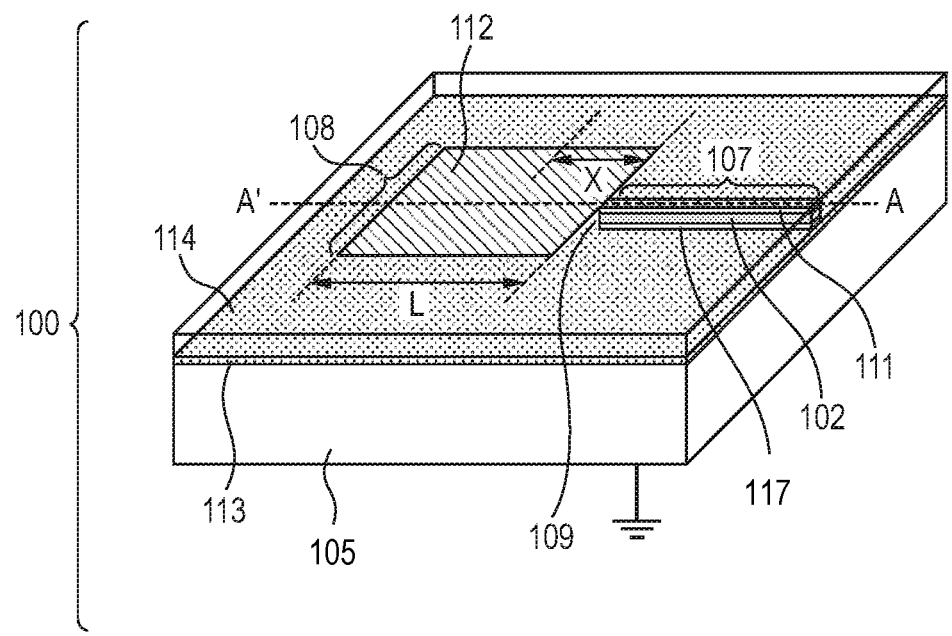
FIG. 1A is a perspective view of an element according to an embodiment of the present invention.
Figure 1B:
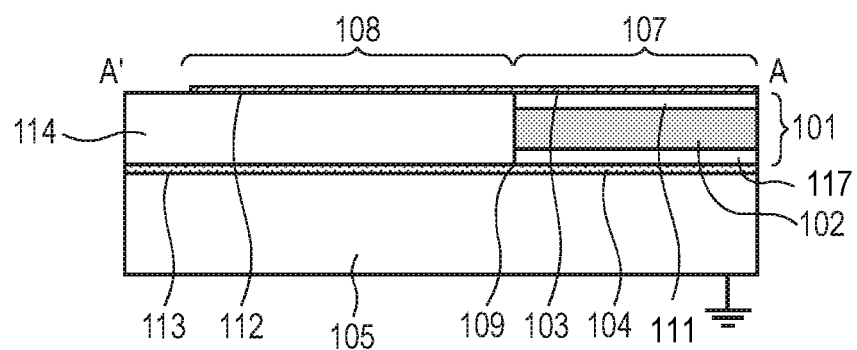
FIG. 1B is a cross-sectional view of the element according to the embodiment of the present invention.
Figure 2A:
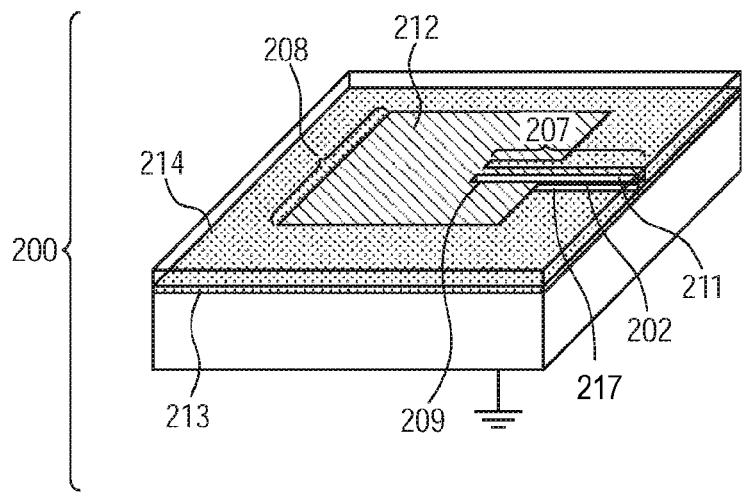
FIG. 2A is a perspective view of an element according to another example of the present invention.
Figure 2B:
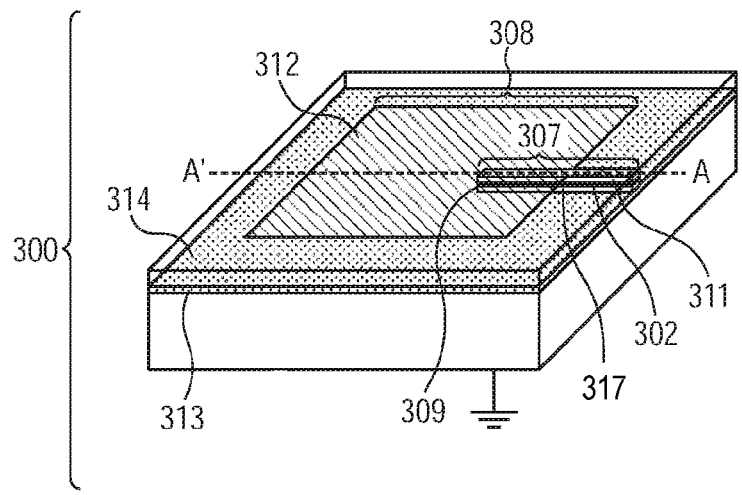
FIG. 2B is a perspective view of an element according to another example of the present invention.
Figure 2C:
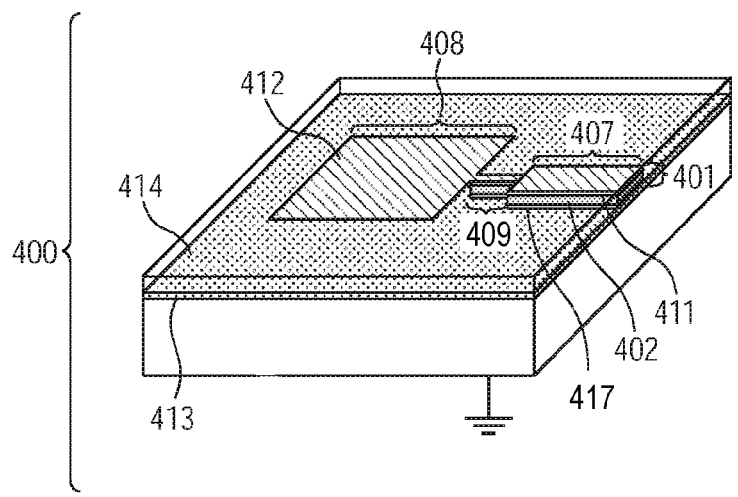
FIG. 2C is a perspective view of an element according to another example of the present invention.
Figure 3A:
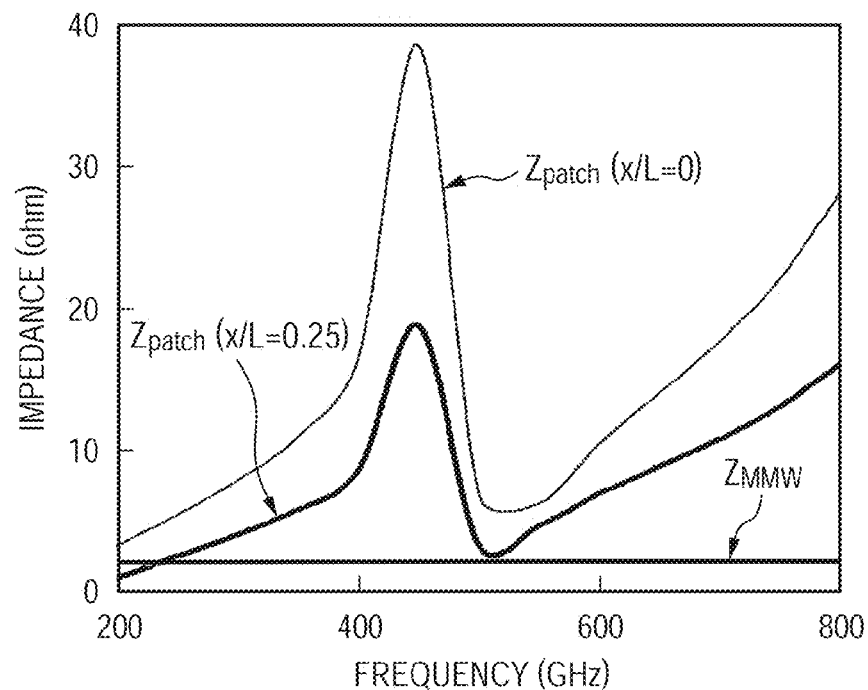
FIG. 3A is a graph showing frequency characteristics of an impedance of the element according to the embodiment of the present invention.
Figure 3B:
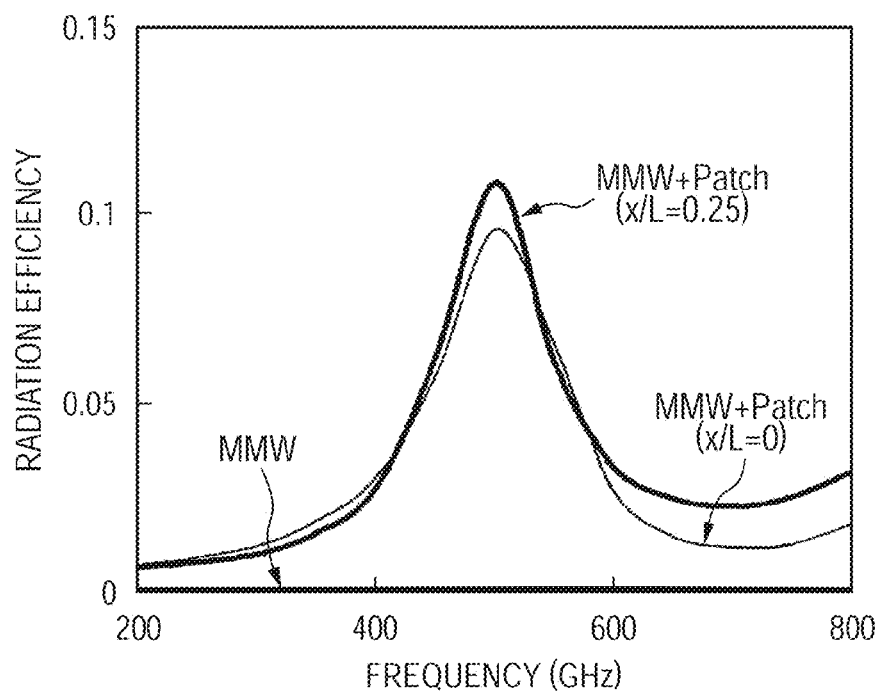
FIG. 3B is a graph showing frequency characteristics of radiation efficiency of the element according to the embodiment of the present invention.
Figure 4A:
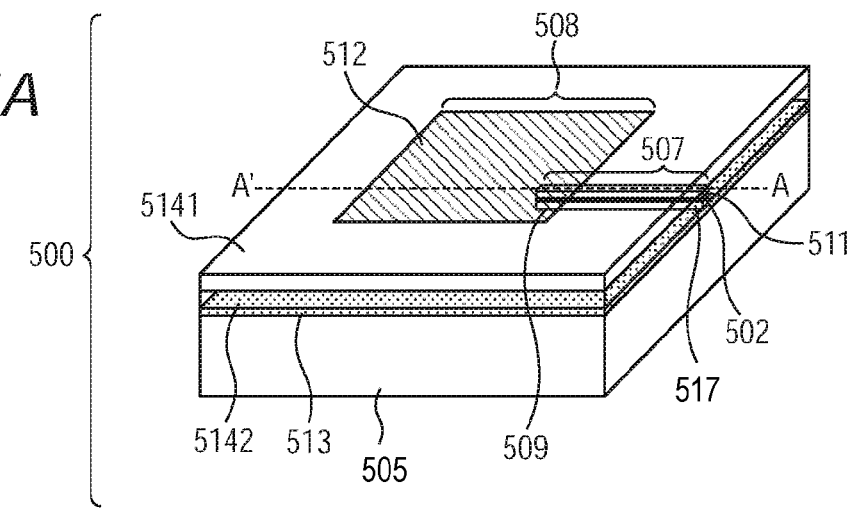
FIG. 4A is a perspective view of an element according to another example of the present invention.
Figure 4B:
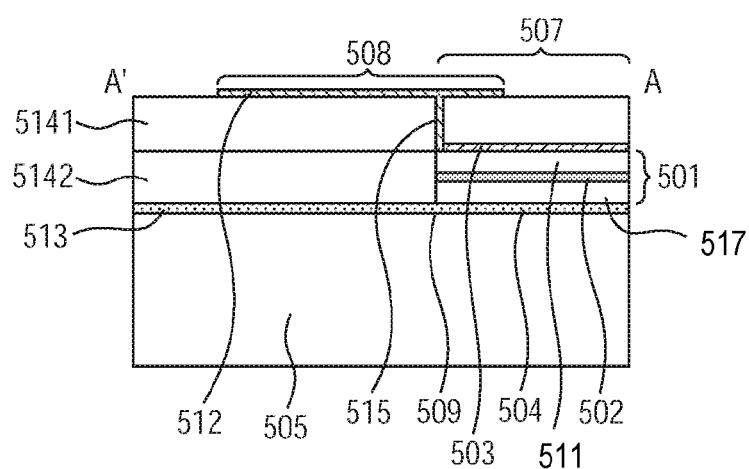
FIG. 4B is a cross-sectional view of an element according to another example of the present invention.
Figure 4C:
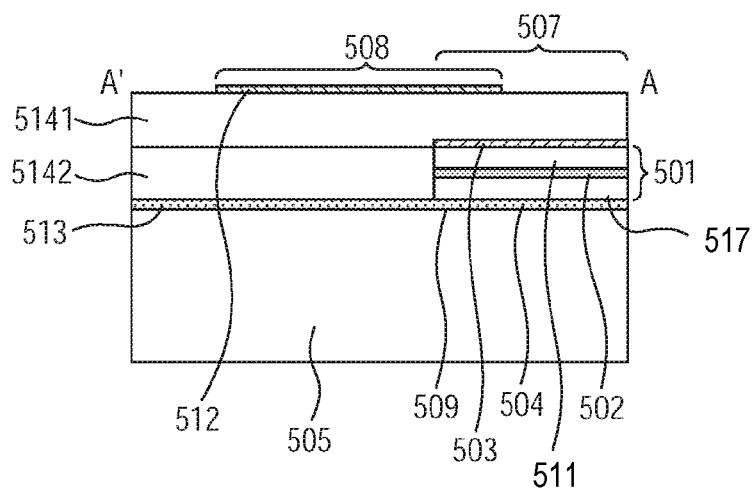
FIG. 4C is a cross-sectional view of an element according to another example of the present invention.

An element 100 according to an embodiment of the present invention is described with reference to FIGS. 1A to 4C. FIGS. 1A and 1B are schematic diagrams illustrating an external appearance of the element 100, in which FIG. 1A is a perspective view, and FIG. 1B is an A-A' cross-sectional view. FIGS. 2A to 2C are diagrams illustrating modified examples of the element of this embodiment, in which FIG. 2A is a perspective view of an element 200, FIG. 2B is a perspective view of an element 300, and FIG. 2C is a perspective view of an element 400. FIGS. 3A and 3B are diagrams illustrating examples of characteristics of the element of the present invention. FIGS. 4A to 4C are diagrams illustrating an element 500 as another modified example of this embodiment, in which FIG. 4A is a perspective view, and FIGS. 4B and 4C are A-A' cross-sectional views.

The element 100 of this embodiment is an oscillation element using a waveguide 107 as a resonator, which includes an active layer 101 having an electromagnetic wave gain, a first conductor layer 103, and a second conductor layer 104. The waveguide 107 is integrated on a substrate 105. The waveguide 107 is an optical waveguide called a DMW including the first conductor layer 103 and the second conductor layer 104 as a clad, with the active layer 101 to be a core sandwiched between the two adjacent conductor layers. In other words, the waveguide is defined by the first and second conductor layers, and the core layer having a layered structure which is arranged so as to be brought into contact with the first and second conductor layers and includes a semiconductor arranged between the first and second conductor layers. The first conductor layer 103 and the second conductor layer 104 are made of a medium having a negative dielectric constant with a negative dielectric constant real part for an electromagnetic wave in an oscillation mode. The distance between the first conductor layer 103 and the second conductor layer 104 is a guide wavelength ($\lambda_g$) or smaller, preferably $\lambda_g/2$ or smaller, and more preferably approximately $\lambda_g/10$, where $\lambda_g$ represents the guide wavelength in the waveguide 107 for the electromagnetic wave to be oscillated or detected. In this case, the electromagnetic wave in a terahertz wave frequency region radiated from or received at an end of the waveguide propagates in the waveguide 107 in a plasmon mode where there is no diffraction limit. Here, the guide wavelength ($\lambda_g$) in a waveguide mode or the oscillation mode is expressed by $\lambda_g = \lambda/n_e$, where $\lambda$ represents a wavelength of an electromagnetic wave in a vacuum, and $n_e$ represents an equivalent refractive index of the waveguide 107. In addition, in order to obtain the resonance and oscillation with the guide wavelength $\lambda_g$, a length L of the waveguide 107 in a longitudinal direction (namely, a direction A-A') as a propagation direction of the electromagnetic wave is set to an integral multiple of $\lambda_g/2$, as known well in semiconductor laser technology.

The active layer 101 includes a semiconductor 102 having a multiple quantum well structure for generating terahertz waves by intersubband transition of carriers, and has an electromagnetic wave gain in the terahertz wave frequency region. As the structure of the semiconductor 102, for example, a resonant tunnel structure including a semiconductor multilayer of several tens of layers or a quantum cascade laser (QCL) structure including a semiconductor multilayer of several hundreds to several thousands of layers is suitable. This embodiment is described as a case in which a resonant tunnel diode (hereinafter also referred to as RTD) or the quantum cascade laser (QCL) structure is used for the semiconductor 102 of the active layer 101. RTD has an electromagnetic wave gain in a millimeter wave frequency region to the terahertz wave frequency region based on the photon-assisted tunneling phenomenon in the negative differential resistance region. QCL has an electromagnetic wave gain in the terahertz wave frequency region based on effective inverted distribution due to resonant tunneling phenomenon and non-light emission high-speed transient phenomenon of carriers.

Further, as the semiconductor 102, it is possible to use a high frequency element such as an Esaki diode, a Gunn diode, or a transistor with a terminated terminal. In addition, it is also appropriate to use a TUNNETT diode, an IMPATT diode, or a heterojunction bipolar transistor (HBT). Further, it is also appropriate to use a compound semiconductor field-effect transistor (FET), or a high electron mobility transistor (HEMT). In addition, it is also possible to use a Josephson element utilizing a superconductor. In addition, the semiconductor 102 may have nonlinearity of carriers in the terahertz wave frequency region, and in this case, the element 100 works as a detection element.

The active layer 101 may include highly doped semiconductor layers 111 and 117 for connecting the semiconductor 102 having a multiple quantum well structure to the first conductor layer 103 as well as the second conductor layer 104. The active layer 101 and the first conductor layer 103 as well as the second conductor layer 104 are mechanically and electrically contacted with each other. The waveguide 107 has a structure in which a bias is applied from an external power supply to between the first conductor layer 103 and the second conductor layer 104 so that a bias is applied to the semiconductor 102 such as RTD or QCL included in the active layer 101. Here, metal (such as Ag, Au, Cu, Al, or AuIn alloy), semimetal (such as Bi, Sb, ITO, or ErAs), highly doped semiconductor, or the like can be appropriately used for the first conductor layer 103 and the second conductor layer 104.

The element 100 of this embodiment includes a resonance antenna 108 for radiating or receiving the electromagnetic wave at a part of the waveguide 107, for example, for radiating or receiving the electromagnetic wave at an end of the waveguide 107. In addition, an impedance matching portion 109 for matching the impedance between the waveguide 107 and the resonance antenna 108 is arranged between the waveguide 107 and the resonance antenna 108. The resonance antenna 108 is an antenna utilizing a resonance phenomenon of electric or magnetic current generated in the antenna, and is also called a standing wave antenna. The resonance antenna 108 strongly radiates or receives the electromagnetic wave with an operating frequency in a relatively narrow band whose center frequency is a resonance frequency at which a resonator length of the antenna becomes an integral multiple of a half wavelength. As the resonance antenna, there are a patch antenna, a microstrip antenna, a slot antenna, a dipole antenna, a loop antenna, and a folded dipole antenna, for example. In this embodiment, an example in which the patch antenna 108 is used as the resonance antenna 108 is mainly described.

The patch antenna 108 has a structure in which two conductors, namely a patch conductor 112 and a ground conductor 113 sandwich a dielectric 114, and a length of the patch conductor 112 in the direction A-A' (namely, the resonator length L) is set to $\lambda/2$. A standing electromagnetic field of a resonance frequency f defined by the resonator length L is formed between the patch conductor 112 and the ground conductor 113 so as to radiate or receive an electromagnetic wave in a relatively narrow band whose center frequency is the resonance frequency f. In this case, the electromagnetic wave is radiated or received by the patch antenna 108 along an upward or downward direction that is substantially perpendicular to the propagation direction (direction A-A') of the electromagnetic wave propagating in the waveguide 107, in other words, a lamination direction of the semiconductor 102. In this embodiment, the patch conductor 112 and the ground conductor 113 constituting the patch antenna 108 are also used as the first conductor layer 103 and the second conductor layer 104, respectively. However, using the patch conductor 112 and the ground conductor 113 also as the first conductor layer 103 and the second conductor layer 104, respectively, is not necessarily required, but it is possible to arrange the patch conductor 112 and the ground conductor 113 separately by using different conductors.

The impedance matching portion 109 is a structure for adjusting impedance matching between the waveguide 107 and the resonance antenna 108. An example of the impedance matching portion 109 of this embodiment is a member or a structure in which input and output impedances of the waveguide 107 and the resonance antenna 108 are made close to each other so as to suppress reflection or phase shift of the electromagnetic wave therebetween for enabling smooth transmission of the electromagnetic wave. In other words, the impedance matching portion is a member or a structure for adjusting a characteristic impedance of the impedance matching portion so as to adjust a matching degree of the input and output impedances between the waveguide and the resonance antenna. In this embodiment, in a simplified manner, characteristic impedances of the waveguide 107 and the resonance antenna 108 are adjusted so as to perform impedance matching therebetween, and hence output and input efficiency of the electromagnetic wave is adjusted. For instance, when the element 100 is used as an oscillation element, if the characteristic impedance of the waveguide 107 is substantially equal to that of the resonance antenna 108 (they are not required to be completely identical to each other for generating oscillation), oscillation output can be increased by the impedance matching. In addition, if the characteristic impedances are shifted a little from each other, use efficiency of the input energy that contributes to the oscillation is improved a little, and hence threshold current for the oscillation can be suppressed. In addition, the waveguide is a laser resonator having a role of forming a standing electromagnetic wave in the waveguide. Therefore, it is necessary that both end surfaces of the waveguide reflect a certain amount of the electromagnetic wave or more. Therefore, by designing such that impedances are not completely matched at an interface between the waveguide and the impedance matching portion, power of the oscillation output can be maximized.

The characteristic impedance of the plasmon waveguide such as the waveguide 107 depends on a structure such as a thickness of the semiconductor 102 in the active layer 101 or a width of the waveguide 107 and component materials, and typically has a value in a range of 0.1 to 100Ω, so as to form a structure having a relatively low impedance. If the RTD having a film structure described later in Example 1 is used for the active layer 101, the thickness of the semiconductor 102 in the active layer 101 is approximately 30 nm, and the width of the waveguide 107 is 5 μm. Therefore, the characteristic impedance of the waveguide 107 is simply estimated to be approximately 2Ω. In addition, if the semiconductor 102 has a thickness of 1 μm and the waveguide 107 has a width of 10 μm in a structure used often for the QCL, the characteristic impedance is estimated to be approximately 10Ω. If the semiconductor 102 has a thickness of 10 μm and the waveguide 107 has a width of 150 μm in a structure used often for the QCL, the characteristic impedance is estimated to be approximately 7Ω. In this way, the plasmon waveguide has a lower impedance than a characteristic impedance of the air (377Ω). Therefore, input and output of the beam have not been efficiently performed conventionally because of the reflection or the phase shift due to impedance mismatch between the waveguide and the air.

The element 100 of this embodiment is equipped with the resonance antenna 108 at the end surface. The characteristic impedance of the resonance antenna is in a range of 50 to 300Ω in a patch antenna and is in a range of 50 to 1,000Ω in a slot antenna, for example. Therefore, by selecting appropriate antenna structure and size, it is possible to make a characteristic impedance of the antenna be close to a characteristic impedance of the plasmon waveguide. Further, the example of the element 100 in this embodiment includes the impedance matching portion 109 arranged between the waveguide 107 and the resonance antenna 108. The impedance matching portion 109 enables the input and output impedances between the waveguide 107 and the resonance antenna 108 to be adjusted, and hence impedance matching between the plasmon waveguide and the resonance antenna 108 can be adjusted. For the impedance matching portion 109, it is possible to appropriately use an offset feed structure (FIG. 2A, FIG. 2B, and FIG. 4A), a $\lambda_g/4$ matching circuit (FIG. 2C), a coupled feed structure (FIG. 4C), or the like, which are widely used for a resonance antenna. In addition, as in the example illustrated in FIG. 1A, by appropriately designing a structure of the resonance antenna 108 so that the antenna has a low impedance, it is possible that the antenna itself also has a role as the impedance matching portion 109.

FIGS. 3A and 3B are graphs showing examples of characteristics of the element 100 of the present invention, in which FIG. 3A shows frequency characteristics of impedance, and FIG. 3B shows frequency characteristics of radiation efficiency. FIGS. 3A and 3B show results of analysis of a structure of the element 100 disclosed later in Example 1 by using a high frequency simulator HFSS of Ansoft Corporation. In other words, FIGS. 3A and 3B show results of analysis of an input impedance ($Z_{patch}$) of the patch antenna, a characteristic impedance ($Z_{MMW}$) of the waveguide 107, and frequency characteristics of the radiation efficiency. It is understood from FIG. 3A that the radiation efficiency is improved when the patch antenna of Example 1 having an input impedance $Z_{patch}(x/L=0)$ is connected to an end of the waveguide 107 having the characteristic impedance $Z_{MMW}$ of approximately 2Ω. In other words, because impedances of the waveguide 107 and the antenna 108 are matched around 500 GHz of resonance frequency of the patch antenna, the radiation efficiency is improved by approximately two digits compared with a case of the waveguide 107 alone, as shown in FIG. 3B. In this case, because the antenna structure is designed so that the resonance antenna 108 has a low impedance, the antenna itself also has a role as the impedance matching portion 109 so that the impedance matching is realized. Specifically, because a characteristic impedance $Z_c$ of the patch antenna is approximately expressed as $Z_c=377 \times t \times w^{-1} \times \epsilon_r^{-1/2}$, the $\lambda/2$ patch antenna for 500 GHz having a large patch width and a small dielectric thickness is designed so that $Z_c$ becomes a low impedance. In this way, the above-mentioned structure is realized. Here, t represents a thickness of the dielectric 114, w represents a width of the patch antenna 108, and $\epsilon_r$ represents a specific dielectric constant of the dielectric 114.

When an end of the waveguide 107 having the characteristic impedance $Z_{MMW}$ of approximately 2Ω is coupled to the patch antenna 108 of Example 1 at a point inward from the end of the patch antenna 108 by x=50 µm, the input impedance $Z_{patch}(x/L=0.25)$ can be further reduced around 500 GHz. Therefore, the radiation efficiency can be improved by approximately 10% compared with the case of x/L=0, as shown in FIG. 3B. This is also understood from the fact that an input impedance $Z_{in}(x)$ of the patch antenna becomes maximum ($Z_{in}(0)$) at the end while an input impedance $Z_{in}(x)$ becomes approximately 0Ω at the center of the patch antenna ($Z_{in}(x)=Z_{in}(0)\cos^2(\pi \cdot x/L)$) due to an effect of the offset feed. In this way, when the feed position of the waveguide 107 is moved from the center to the end of the resonance antenna 108, the feed position at which an impedance is matched can always be found.

As a method of the offset feed for the patch antenna, there is a method of forming a notch in a patch conductor 212 as in the element 200 illustrated in FIG. 2A, for example, and connecting a waveguide 207 thereto so that both sides of the waveguide 207 are apart from the patch conductor. In FIG. 2A, a part corresponding to the part in FIGS. 1A and 1B is denoted by numeral of 200s having the same two lower digits. In addition, if the method of connection in such a manner that a part of a waveguide 307 is embedded in a patch antenna 308 is used as in the element 300 of FIG. 2B, the impedance matching can be adjusted to realize a relatively low loss. Here, the first conductor layer of the waveguide 307 is connected to the patch conductor. In FIG. 2B, a part corresponding to the part in FIGS. 1A and 1B is denoted by numeral of 300s having the same two lower digits. In addition, if a waveguide 507 and an antenna 508 are connected to each other by using a plug 515 as illustrated in FIG. 4B, thicknesses of a dielectric 5141 and a dielectric 5142 can be adjusted to be arbitrary values so that impedance matching between the waveguide 507 and the antenna 508 can be adjusted. In FIGS. 4A to 4C, a part corresponding to the part in FIGS. 1A and 1B is denoted by numeral of 500s having the same two lower digits. In addition, it is possible to adopt a structure in which a $\lambda_g/4$ matching circuit is used for an impedance matching portion 409 so as to perform impedance matching between a waveguide 407 and the antenna 408 as in the element 400 of FIG. 2C. The $\lambda_g/4$ matching circuit has a length of $\lambda_g/4$ in a waveguide direction and has an impedance in a range between the impedance of the waveguide 407 and the impedance of the antenna 408. In FIG. 2C, a part corresponding to the part in FIGS. 1A and 1B is denoted by numeral of 400s having the same two lower digits.

Further, it is not necessary that the coupling between the waveguide and the antenna has such structure of the above-mentioned DC coupling. For instance, it is possible to adopt a coupled feed structure in which the waveguide 507 and the antenna 508 are AC coupled as in the element 500 illustrated in FIG. 4C. In this case, by adjusting the insertion position of the antenna 508, the impedance matching between the waveguide 507 and the antenna 508 can be performed. In addition, the antenna may be a microstrip antenna type resonator using a microstrip line or the like that has a finite length and operates in a terahertz wave band. The dielectric is a substance in which dielectricity is dominant over conductivity, and is a material that works as a high resistance resistor or an insulator conducting no electricity for a DC voltage. Typically, a material having a resistivity of 1 kΩm or larger is appropriate for the dielectric. As specific examples, there are plastic, ceramic, silicon oxide, silicon nitride, and the like.

Figure 5A:
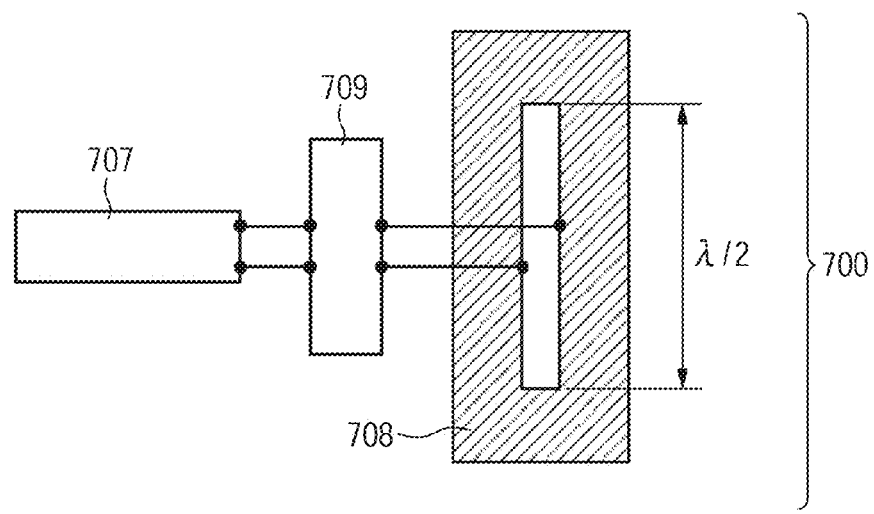
FIG. 5A is an explanatory diagram of an element according to another example of the present invention.
Figure 5B:
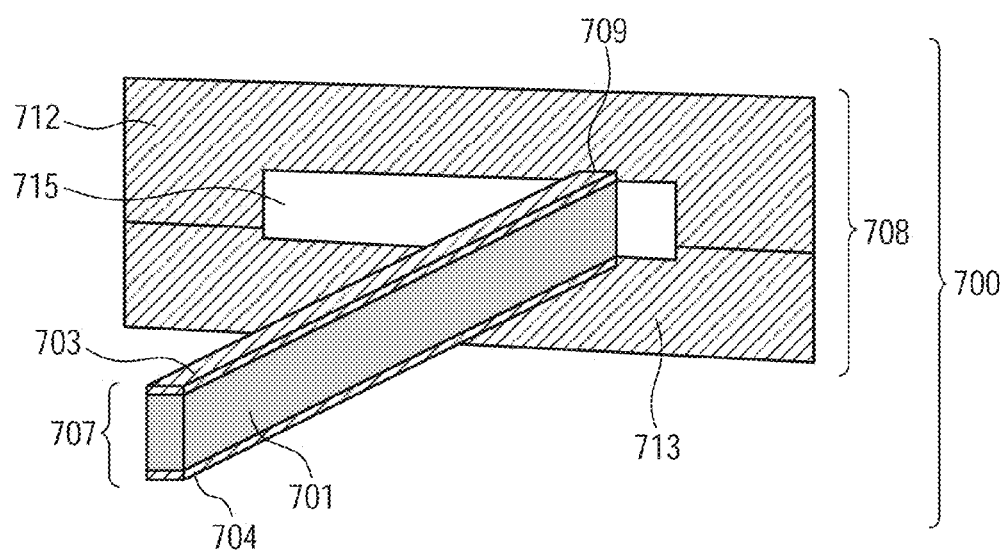
FIG. 5B is an overview diagram of an element according to another example of the present invention.
Figure 6A:
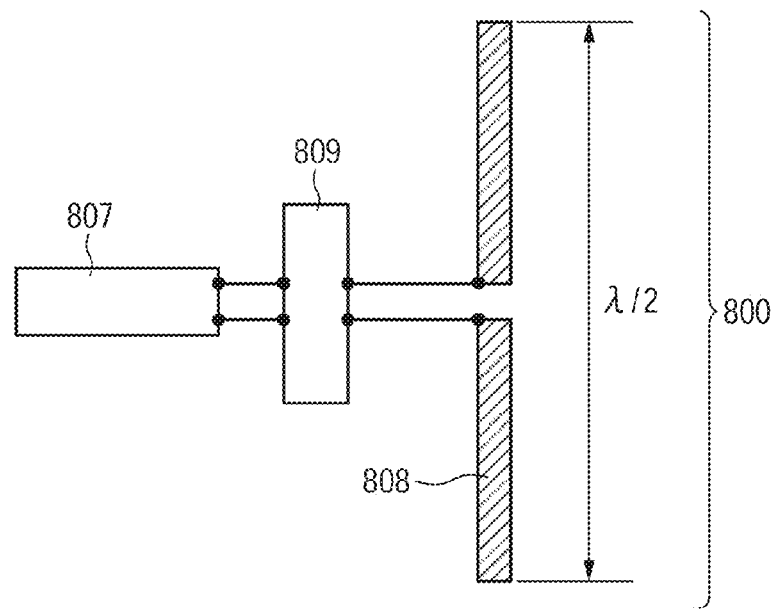
FIG. 6A is an explanatory diagram of an element according to another example of the present invention.
Figure 6B:
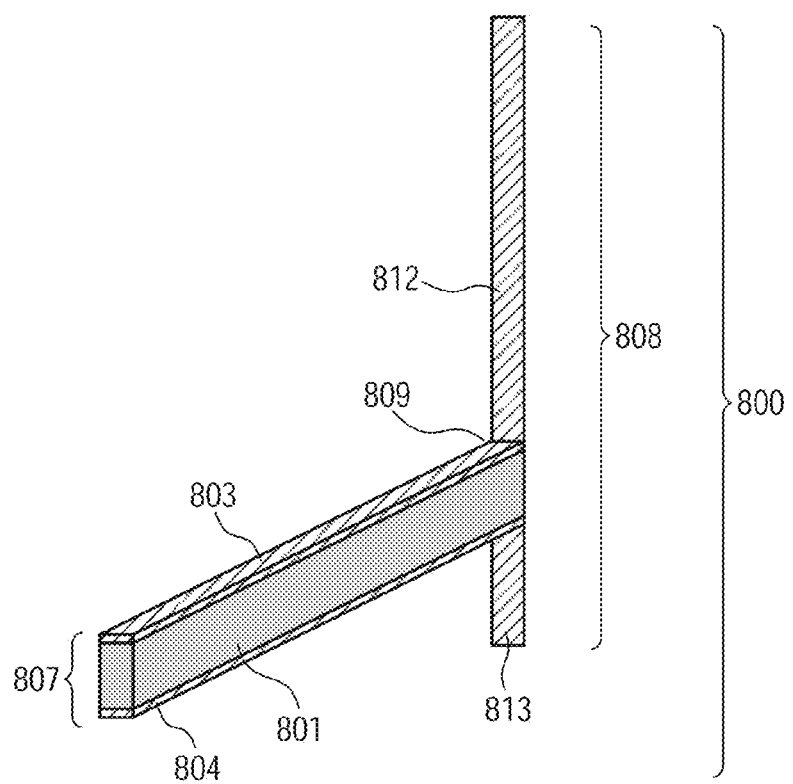
FIG. 6B is an overview diagram of an element according to another example of the present invention.
Figure 7A:
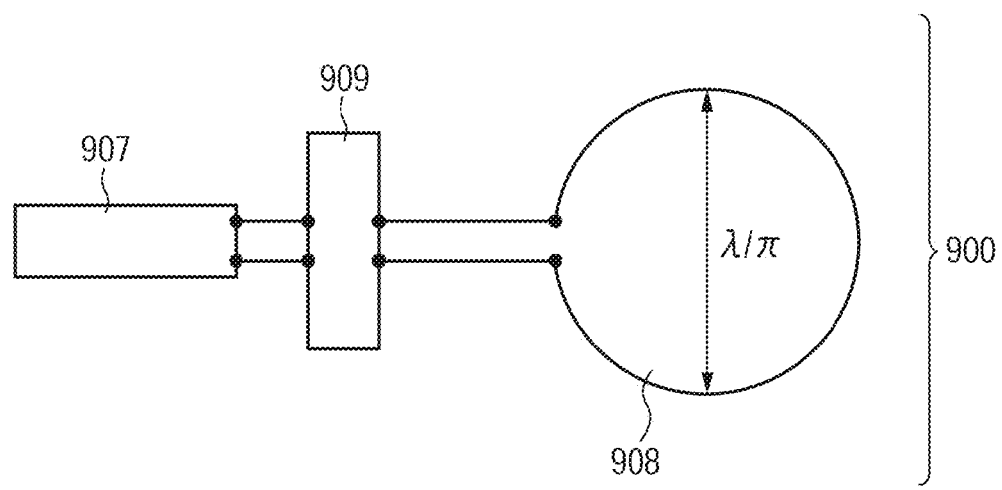
FIG. 7A is an explanatory diagram of an element according to another example of the present invention.
Figure 7B:
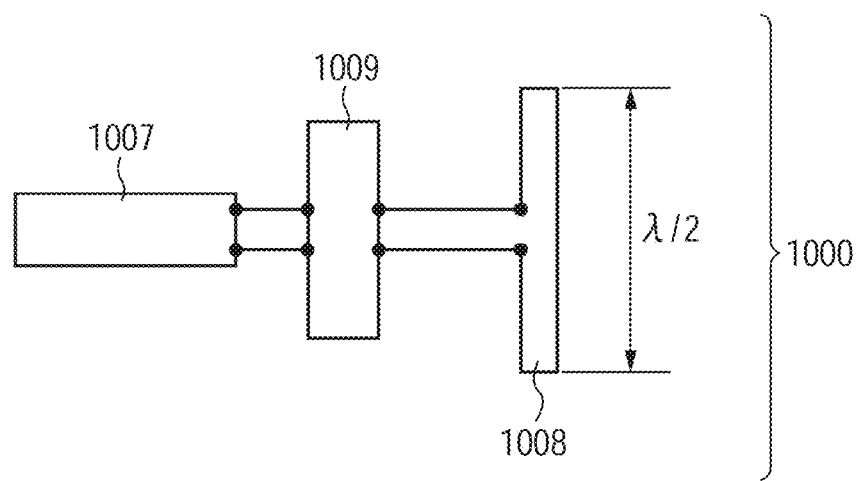
FIG. 7B is an explanatory diagram of an element according to another example of the present invention.

As another example of the resonance antenna, FIGS. 5A and 5B illustrate a structure in which a waveguide 707 and a half wavelength slot antenna 708 are coupled via an impedance matching portion 709. The waveguide 707 is a plasmon waveguide in which two clads, namely a first conductor layer 703 and a second conductor layer 704 sandwich an active layer 701, and the slot antenna 708 formed of two metal plates 712 and 713 is arranged on the end surface of the waveguide 707. The waveguide 707 is supplied with power from a position offset from the center of the slot antenna 708, and this structure is the impedance matching portion 709. In addition, FIGS. 6A and 6B illustrate an element 800 in which a waveguide 807 is coupled to a half wavelength dipole antenna 808 via an impedance matching portion 809. The half wavelength dipole antenna 808 is arranged on the end surface of the waveguide 807, and conductor layers 803 and 804 are connected to metal plates 812 and 813. In this case, the structure in which the waveguide 807 is supplied with power from a position offset from the center of the dipole antenna 808 is the impedance matching portion 809. In addition, there are also a structure as illustrated in FIG. 7A in which a waveguide 907 and a one-wavelength loop antenna 908 are coupled to each other via an impedance matching portion 909, and a structure as illustrated in FIG. 7B in which a waveguide 1007 and a half-wavelength folded dipole antenna 1008 are coupled to each other via an impedance matching portion 1009.

As described above, according to this embodiment, the impedance matching portion is arranged in a part for radiating or receiving the electromagnetic wave in the plasmon waveguide. In this way, impedances of the waveguide and the antenna can be matched, and hence radiation efficiency or reception efficiency of the electromagnetic wave that is radiated from the waveguide or received by the waveguide can be improved outstandingly. In addition, because a directivity pattern of the electromagnetic wave can be directed to the upward or downward direction that is substantially perpendicular to an optical axis direction of the electromagnetic wave propagating in the waveguide, improvements can be expected in directivity of the radiated or received electromagnetic wave, and handling of the electromagnetic wave. Therefore, it is expected with this embodiment to realize the element that can efficiently use the electromagnetic wave.

Further, although the electromagnetic wave is conventionally radiated with a wide radiation angle from the end surface of the plasmon waveguide, this structure enables the electromagnetic wave to be radiated in the upward direction substantially perpendicular to the propagation direction of the electromagnetic wave in the waveguide, and can improve the directivity by using the resonance antenna such as the patch antenna. Therefore, the directivity pattern of the electromagnetic wave can be stabilized in the optical axis direction so that the electromagnetic wave can be easily handled. In addition, by planar integration of the antenna to the plasmon waveguide, it can be expected to reduce tilt of the electromagnetic wave or unstableness of the frequency characteristics due to physical and mechanical unstableness caused by conventional integration of a silicone lens or a three-dimensional antenna. Therefore, improvement of physical and mechanical stability and process accuracy can be expected, and the effect of cost reduction by reducing the number of optical components such as lenses can also be expected. Thus, this embodiment can realize a small and durable element that can efficiently utilize the electromagnetic wave, and can realize a semiconductor element or a waveguide element such as an oscillation element or a detection element using the element.

In the following, more specific examples are described.

Example 1

Specific Example 1 of the element according to the present invention is described with reference to FIGS. 1A to 4C. Here, the element 100 according to the present invention can be used as a simple waveguide for electromagnetic waves, but it is possible to constitute a semiconductor element such as an oscillation element, an electromagnetic wave detection element, and an electromagnetic wave amplifying element by arranging the core layer to have an electromagnetic wave gain or nonlinearity. In the following description, as an example thereof, there is described an example in which the element of the present invention is used for the oscillation element. In this case, the element is constituted as the oscillation element with the core layer having the gain of the electromagnetic wave, and the first and second conductor layers each having a negative dielectric constant real part for the electromagnetic wave in the oscillation mode.

In this example, an InGaAs/InAlAs-based resonant tunneling diode (RTD) structure is used as the semiconductor 102, which is a semiconductor multiple quantum well structure for generating a terahertz wave by intersubband transition and lattice-matches with an InP substrate. The RTD structure is a semiconductor multi-layered structure including, in order from a topmost layer, n-InGaAs (50 nm, Si, $1 \times 10^{18}$ cm$^{-3}$), InGaAs (5 nm), AlAs (1.3 nm), InGaAs (7.6 nm), InAlAs (2.6 nm), InGaAs (5.6 nm), AlAs (1.3 nm), InGaAs (5 nm), and n-InGaAs (50 nm, Si, $1 \times 10^{18}$ cm$^{-3}$). Here, the underlined InGaAs layers are to be quantum well layers, and InAlAs-based materials which are not underlined are to be potential barrier layers so as to constitute a triple barrier resonant tunnel structure. AlAs that does not lattice-match with InP is thinner than a critical film and forms a high energy barrier. In addition, the upper and lower n-InGaAs layers doped with high concentration carriers are emitter/collector layers for injecting and extracting electrons into and from the resonant tunnel structure. InGaAs (5 nm) arranged between the emitter/collector layer and the potential barrier layer, respectively, are layers for preventing diffusion of Si as a doping material.

The active layer 101 includes the semiconductor 102 having the RTD structure, and the semiconductor layer 111 and the semiconductor layer 117 that are arranged on the upper and lower sides of the semiconductor 102 and are made of n-InGaAs (1×1019 cm-3) doped with high concentration carriers. A total thickness of the active layer 101 is approximately 3 μm. The doped semiconductor layers connect the RTD of the semiconductor 102 to the second conductor layer 104 and the first conductor layer 103, respectively, with a relatively low resistance. Each of the first conductor layer 103 and the second conductor layer 104 is formed of a Ti/Pd/Au lamination film. The first conductor layer 103 is formed of Ti/Pd/Au/Pd/Ti (having thicknesses of 20 nm/20 nm/400 nm/20 nm/20 nm, respectively). The second conductor layer 104 is formed of Ti/Pd/Au/Pd/Ti (having thicknesses of 20 nm/20 nm/400 nm/20 nm/20 nm, respectively). The substrate 105 is a high resistance silicon substrate and is mechanically connected to the second conductor layer 104. The dielectric 114 is preferably made of an insulating material having a low loss in the terahertz wave band (for example, a resin such as BCB or an inorganic material such as SiO2), and benzocyclobutene (BCB) is used in this example. In the element 100, a bias voltage for driving is supplied to the active layer 101 from a power supply connected between the second conductor layer 104 and the first conductor layer 103.

The waveguide 107 has a Fabry-Perot resonator structure, and includes at least two end surfaces in the propagation direction of the electromagnetic wave. The electromagnetic wave is caused to be standing wave by using reflection from the end surfaces, and hence the length in the propagation direction (longitudinal direction of the waveguide 107) is a factor in determining the oscillation wavelength. In this example, the length of the waveguide 107 is 0.6 mm, which is 20 times as large as $\lambda_g$, and the width of the waveguide 107 is 0.005 mm. Therefore, the first conductor layer 103 and the second conductor layer 104 are each in a rectangular pattern of 1 mm×0.005 mm. In addition, the first conductor layer 103 and the second conductor layer 104 are close to each other with a distance of approximately 3 μm. The waveguide 107 is designed such that the oscillation frequency is 0.5 THz, and the guide wavelength $\lambda_g$ is 30 μm (an equivalent refractive index of the waveguide is set to be approximately 20). The electromagnetic wave propagates in the waveguide 107 in a plasmon mode, in which the end surface of the waveguide 107 becomes an open end, and a position at $\lambda_g/4$ from the end surface becomes a node of the resonance electric field. The element 100 radiates an electromagnetic wave of 0.5 THz generated based on a photon-assisted tunneling effect in a negative differential resistance region from the patch antenna 108 arranged at the end of the waveguide 107.

The patch antenna 108 includes the patch conductor 112 that is a square patch whose side length is L=200 μm (L (length in a direction parallel to the longitudinal direction of the waveguide 107)=w (width in the direction perpendicular to the L direction)=200 μm). Benzocyclobutene (BCB having $\epsilon_r$=2.4 manufactured by Dow Chemical Company) having a thickness t of 3 μm is arranged as the dielectric 114 between the patch conductor 112 and the ground conductor 113. The patch antenna 108 is arranged on one end of the waveguide 107. The patch conductor 112 is connected to the first conductor layer 103, and the ground conductor 113 is connected to the second conductor layer 104. Therefore, an offset amount x of the waveguide 107 (distance between an end of the patch conductor 112 on the waveguide side and the connection portion) is 0 μm, and hence x/L=0 holds. In this case, as understood from FIG. 3A, the characteristic impedance $Z_{MMW}$ of the waveguide 107 is approximately 2Ω, and the input impedance $Z_{patch}$(x/L=0) of the patch antenna 108 connected to the end of the waveguide 107 is approximately 7Ω around 500 GHz. Therefore, because the impedance of the waveguide 107 becomes closer to that of the antenna 108 around 500 GHz of the resonance frequency of the antenna 108, the radiation efficiency is improved by approximately two digits compared with a case of the waveguide 107 alone, as shown in FIG. 3B. In this case, the resonance antenna 108 itself works also as the impedance matching portion 109, to thereby realize the impedance matching.

In addition, as illustrated in FIG. 2A, it is possible to form a notch having a width of 15 μm and a length of 50 μm in the patch conductor 212. Further, the end of the waveguide 207 having a characteristic impedance $Z_{MMW}$ of approximately 2Ω is connected to a position of a patch antenna 208 shifted inward from the end thereof by x=50 μm so as to perform the offset feed (x/L=50/200=0.25). In this case, an input impedance $Z_{patch}$(x/L=0.25) of the antenna 208 becomes approximately 3Ω around 500 GHz, and it is possible to further improve the radiation efficiency as shown in FIG. 3B.

The element 100 in this example can be manufactured by the following manufacturing method. The first substrate 105 made of silicon is prepared, and metal layers of Ti/Pd/Au (having thicknesses of 20 nm/20 nm/200 nm, respectively) are formed on a top surface of the first substrate 105. An InP substrate is prepared, on which a semiconductor layer including the active layer 101 is formed by epitaxial growth. Metal layers of Ti/Pd/Au (having thicknesses of 20 nm/20 nm/200 nm, respectively) are formed on a top surface of the semiconductor layer. The InP substrate is bonded to the first substrate 105 so that top surfaces of the two substrates are opposed to each other, by Au thermocompression bonding. Here, Ti/Pd/Au/Pd/Ti (having thicknesses of 20 nm/20 nm/400 nm/20 nm/20 nm, respectively) formed by the compression bonding becomes the second conductor layer 104 and the ground conductor 113. The InP substrate is removed from the bonded and integrated substrate by grinding and hydrochloric acid etching so as to transfer the semiconductor layer onto the first substrate 105. The semiconductor layer is shaped by the photolithography method and the dry etching method, so as to shape the active layer 101. The active layer 101 is filled with BCB by the spin coat method, and smoothed by the dry etching method so as to form the dielectric 114. Next, a vacuum deposition method and a lift-off method are used to complete the element 100. In other words, the first conductor layer 103 and the patch conductor 112 made of Ti/Pd/Au (having thicknesses of 20 nm/20 nm/200 nm, respectively) are formed on the dielectric 114 and the active layer 101 so as to shape the structure of the waveguide 107 and the patch antenna 108.

The present invention is not limited to the above-mentioned structure. For example, in this example, the active layer 101 described above is a triple barrier resonant tunnel diode formed of InGaAs/InAlAs and InGaAs/AlAs grown on an InP substrate. However, the present invention is not limited to the structure and the materials, and other structures and other combinations of materials may also provide an element according to the present invention. For example, a resonant tunnel diode having a double barrier quantum well structure, a resonant tunnel diode having a multiple barrier quantum well structure of quadruple or more, or a multiple quantum well structure having cascade connections as is known by a quantum cascade laser may be used. Further, a rectifying element such as a Schottky barrier diode or a negative resistance element such as a Gunn diode may also be used. Any of those is suitable for an oscillation element, a detection element, and an amplifying element. With regard to the combination of materials, GaAs/AlGaAs, GaAs/AlAs, or InGaAs/GaAs/AlAs formed on a GaAs substrate may be used. Further, InGaAs/AlGaAsSb formed on an InP substrate, InAs/AlAsSb or InAs/AlSb formed on an InAs substrate, SiGe/SiGe formed on a Si substrate, or the like may also be used. The structure and the materials may be appropriately selected depending on the desired frequency and the like. Further, the material of the substrate may be selected depending on the application purpose. A semiconductor substrate such as a silicon substrate, a gallium arsenide substrate, an indium arsenide substrate, or a gallium phosphorus substrate, a glass substrate, a ceramic substrate, a resin substrate, or the like may also be used.

Further, as the dielectric 114, an inorganic material such as $SiO_2$, polysilicon, $SiN_x$, AlN, or $TiO_2$ or an organic material such as benzocyclobutene (BCB), SU-8, or a polyimide is suitably used. Further, a low conductive intrinsic semiconductor which is regrown may also be used. In addition, the method of manufacturing the element according to the present invention is not limited to the above-mentioned method. For instance, micromachining using a femtosecond laser or an ultrasonic wave, or conventional NC machining may be used.

Example 2

The element 400 according to Example 2 of the present invention is now described with reference to FIG. 2C. A semiconductor 402 of an active layer 401 uses the quantum cascade laser structure, in which repetitions are 8, disclosed in Appl. Phys. Lett. 91, 131122, 2007. The active layer 401 includes the semiconductor 402 made of a semiconductor multi-layered film having a thickness of approximately 1 μm, and a semiconductor layer 411 and a semiconductor layer 417 that are made of n-InGaAs (1×1019 cm-3) having a thickness of approximately 1 μm doped with high concentration carriers. A total thickness of the active layer 401 is approximately 3 μm.

The waveguide 407 has the DMW structure in which the active layer 401 is sandwiched between a first conductor layer 403 and a second conductor layer 404. Other structures and materials are the same as those in Example 1, and the manufacturing method is also substantially the same. The waveguide 407 is a rectangular plasmon waveguide having a width of 30 μm and a length of 1.4 mm. The characteristic impedance of the waveguide 407 is estimated to be approximately 4Ω so that oscillation of approximately 1.2 THz is obtained on design. In the element 400 of this example, a patch antenna 408 is arranged on an end of the waveguide 407 via the λ/4 matching circuit 409 as the impedance matching portion. The patch antenna 408 is a rectangular patch having a resonator length of L=80 μm and a width of w=60 μm, and BCB having a thickness of 3 µm is arranged as a dielectric 414 between the patch conductor 412 and the ground conductor 413.

The characteristic impedance of the patch antenna 408 in this structure is estimated to be approximately 12Ω. The λ/4 matching circuit 409 is designed so that the characteristic impedance becomes $(4 \times 12)^{1/2} = 7\Omega$. In this example, the end of the waveguide 407 is processed and elongated to have a width of 15 µm and a length of 17 µm. In this way, by adopting the structure in which the $\lambda_g/4$ matching circuit is used for the impedance matching portion 409 so that the impedance of the waveguide 407 and the impedance of the antenna 408 are matched, output and input efficient of the element 400 for the electromagnetic wave of 1.2 THz is improved by one digit compared with the case of the waveguide 407 alone. In addition, the directivity pattern of the electromagnetic wave radiated from or received by the element 400 can be directed to the upward or downward direction perpendicular to the optical axis direction of the electromagnetic wave propagating in the waveguide, and hence the directivity of the radiated or received electromagnetic wave is improved.

Example 3

Figure 8A:
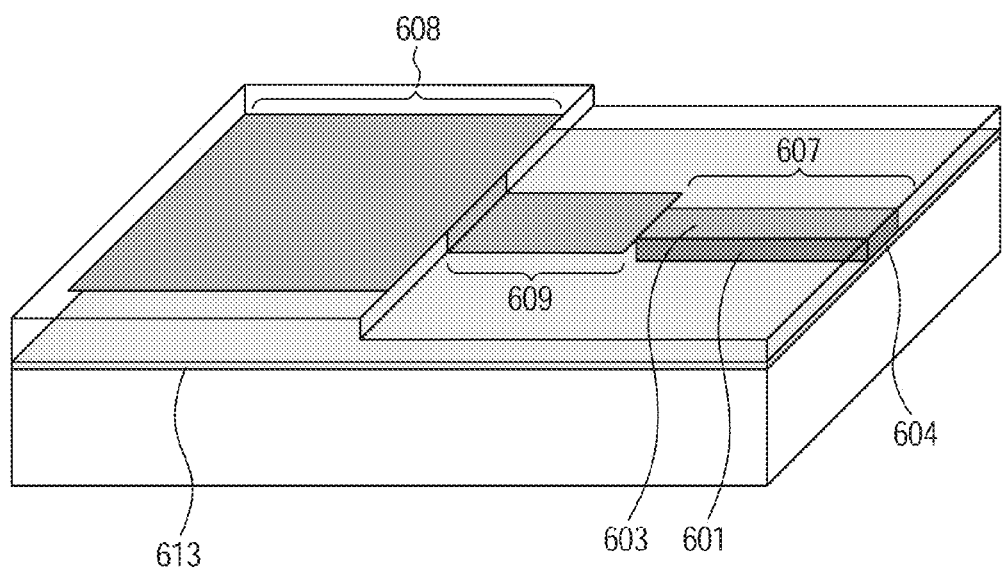
FIG. 8A is a perspective view of an element according to another example of the present invention.
Figure 8B:
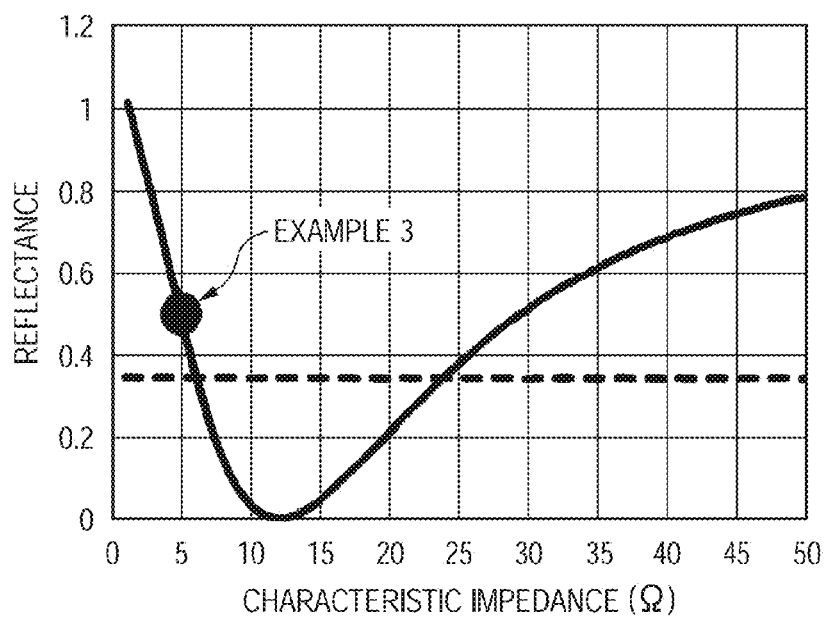
FIG. 8B is a graph showing reflection characteristics of an element according to another example of the present invention.
Figure 8C:
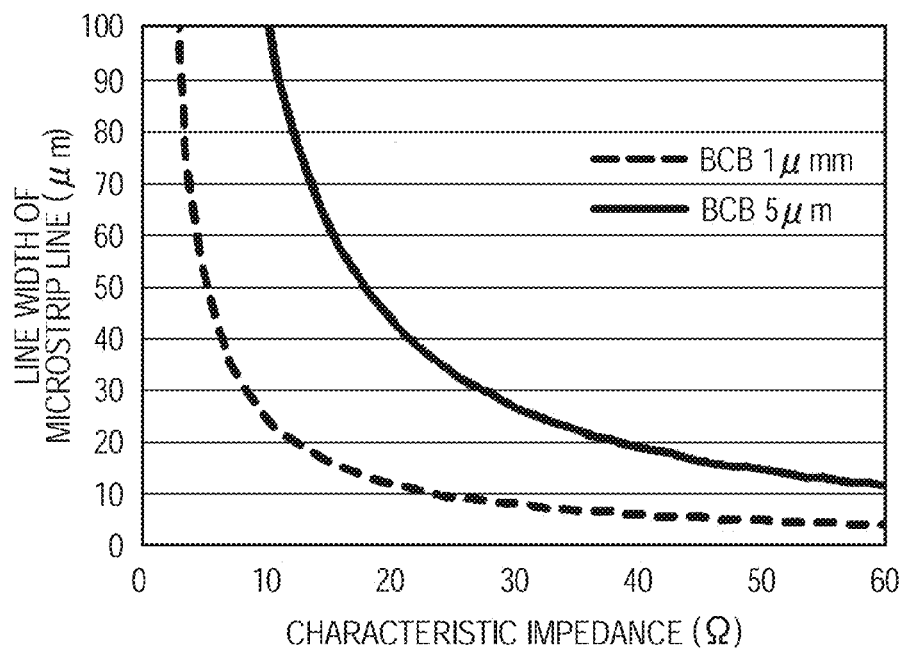
FIG. 8C is a graph showing a line width dependence of an element according to another example of the present invention.
Figure 8D:
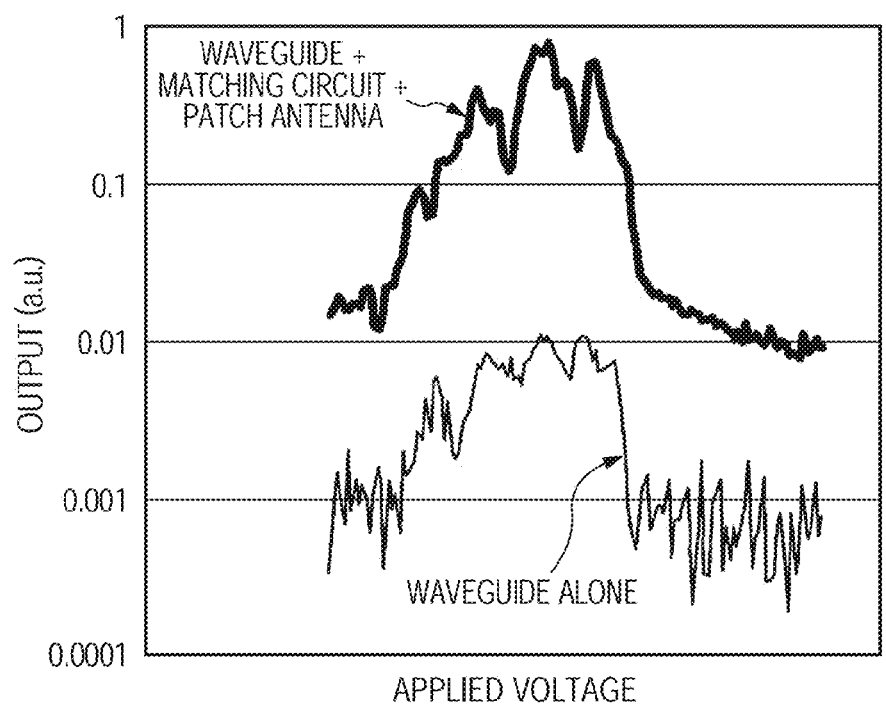
FIG. 8D is a graph showing electromagnetic wave output characteristics of an element according to another example of the present invention.

An element 600 of Example 3 of the present invention is described with reference to FIGS. 8A, 8B, 8C, and 8D. FIG. 8A illustrates a perspective view of the element 600, FIG. 8B shows results of analysis of the reflection characteristic at an interface between a waveguide 607 and a λ/4 matching circuit 609, FIG. 8C shows a dependence between the characteristic impedance of the λ/4 matching portion and a line width of the microstrip line, and FIG. 8D shows output characteristics of the observed electromagnetic wave. An active layer 601, a first conductor layer 603, and a second conductor layer 604 have the same structures as in Example 1. In addition, other structures and materials are the same as those in Example 1. However, a total thickness of the active layer 601 is approximately 1 µm, a size of the patch antenna is 300 µm by 300 µm, and a distance between a patch antenna 608 and a ground conductor 613 is 5 µm. The waveguide 607 has the DMW structure in which the first conductor layer and the second conductor layer sandwich the active layer, and has a rectangular shape having a width of 5 µm and a length of 50 µm (having an oscillation frequency of 0.30 THz). The patch antenna 608 is arranged at the end of the waveguide 607 via the λ/4 matching circuit 609 formed of the microstrip line. An input impedance of the waveguide 607 is 6.4Ω, and an input impedance of the patch antenna 608 is 23.6Ω. By setting the characteristic impedance of the λ/4 matching circuit 609 to $(6.4 \times 23.6)^{1/2} = 12.3\Omega$, the impedance of the waveguide 607 and the impedance of the patch antenna 608 are substantially matched. However, the waveguide 607 is a Fabry-Perot resonator, and it is necessary that a certain amount of the electromagnetic wave or more is reflected by both end surfaces of the waveguide 607 in order to form a standing electromagnetic wave in the waveguide 607. Therefore, it is preferred to design so that complete impedance matching is avoided on the interface between the waveguide 607 and the λ/4 matching circuit 609, that is, so that there is impedance mismatch. In this example, the resonance is generated in the waveguide if the reflectance is above a value shown in FIG. 8B by a dot line, specifically if the reflectance is 0.34 or larger. Therefore, it is preferred to set the characteristic impedance of the microstrip line as the λ/4 matching circuit 609 to approximately 7Ω or smaller, or approximately 24Ω or larger. Here, a solid line in FIG. 8B shows results of analysis of the reflection characteristic of the electromagnetic wave on the interface between the waveguide 607 and the λ/4 matching circuit 609, and reflection of the electromagnetic wave due to general impedance mismatch was calculated as a model. In addition, "gain of active layer 601>(waveguide loss of waveguide 607+reflection loss of waveguide end)" holds in a region where the reflectance of the electromagnetic wave on the interface between the waveguide 607 and the λ/4 matching circuit 609 is above the dot line in FIG. 8B, which indicates that the electromagnetic wave is resonated to be a standing wave in the waveguide 607. Therefore, in this example, the length (150 µm) of the microstrip line as the λ/4 matching circuit 609, the line width (50 µm), and the thickness (approximately 1 µm) of the dielectric layer sandwiched between the microstrip line and the ground conductor are adjusted, and the characteristic impedance of the λ/4 matching circuit 609 is set to 5Ω. In this case, the reflectance when the λ/4 matching circuit 609 is viewed from the waveguide 607 is approximately 0.5. Here, as shown in FIG. 8C, by changing the line width of the microstrip line as the λ/4 matching circuit 609 and the film thickness of the dielectric layer (BCB) sandwiched between the microstrip line and the ground conductor, the characteristic impedance can be adjusted. With the structure of the impedance matching portion 609 described above, as shown in FIG. 8D, the electromagnetic wave output was able to be observed at room temperature, which was approximately 80 times higher than that in the case of the waveguide 607 alone. In this case, oscillation frequencies of the element with the single waveguide and the element integrated with the λ/4 matching circuit and the patch antenna on the waveguide end were measured to be 0.30 THz both, which indicates that the electromagnetic wave resonated in the waveguide 607 is efficiently extracted to the outside by integrating the λ/4 matching circuit and the patch antenna to the waveguide end. As described in this example, the radiation efficiency of the electromagnetic wave radiated from the waveguide was able to be improved.

As described above, according to the embodiment of the present invention, the resonance antenna and the impedance matching portion for coupling the waveguide to the resonance antenna are arranged at the part of the waveguide for radiating or receiving the electromagnetic wave. Thus, the impedance of the waveguide and the impedance of the antenna are matched, and hence radiation efficiency or reception efficiency of the electromagnetic wave radiated from the waveguide or received by the waveguide is improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2013-054449, filed Mar. 16, 2013, and No. 2014-006359, filed Jan. 17, 2014, which are hereby incorporated by reference herein in their entirety.

The invention claimed is:
1. An element, comprising:
a waveguide for guiding an electromagnetic wave;
a resonance antenna for forming a standing electromagnetic field of the electromagnetic wave, the resonance antenna being arranged at a part of the waveguide for radiating or receiving the electromagnetic wave; and
an impedance matching portion for matching an impedance of the waveguide with an impedance of the resonance antenna so as to couple the waveguide to the resonance antenna, wherein the waveguide includes:
a first conductor layer and a second conductor layer each having a negative dielectric constant real part for the electromagnetic wave; and
a core layer arranged between the first conductor layer and the second conductor layer, and
wherein the core layer has a gain of the electromagnetic wave or a nonlinearity of carriers for the electromagnetic wave.

2. The element according to claim 1, wherein the core layer has a layered structure which is in contact with the first conductor layer and the second conductor layer and includes a semiconductor.

3. The element according to claim 2, wherein the core layer comprises a multiple quantum well structure for generating a terahertz wave by intersubband transition of carriers.

4. The element according to claim 2,
wherein the core layer has the gain of the electromagnetic wave,
wherein the resonance antenna is arranged at the part of the waveguide from which the electromagnetic wave is radiated, and
wherein the electromagnetic wave is radiated from the resonance antenna.

5. The element according to claim 2,
wherein the core layer has the nonlinearity of carriers for the electromagnetic wave,
wherein the resonance antenna is arranged at the part of the waveguide by which the electromagnetic wave is received, and
wherein the electromagnetic wave is received by the resonance antenna.

6. The element according to claim 1, wherein the part of the waveguide comprises an end portion of the waveguide.

7. The element according to claim 1, wherein the impedance matching portion has a structure for an offset feed.

8. The element according to claim 1, wherein the resonance antenna further works as the impedance matching portion.

9. The element according to claim 1, wherein the resonance antenna comprises a microstrip antenna or a patch antenna.

10. The element according to claim 1, wherein the resonance antenna has a structure for radiating or receiving the electromagnetic wave in one of an upward direction and a downward direction that is perpendicular to a propagation direction of the electromagnetic wave propagating in the waveguide.

11. The element according to claim 1, wherein the first conductor layer and the second conductor layer are close to each other at a distance of a guide wavelength ($\lambda_g$) or smaller in one of a waveguide mode and an oscillation mode, when $\lambda_g = \lambda/n_e$ holds, where $\lambda$ represents a wavelength of the electromagnetic wave in a vacuum, and $n_e$ represents an equivalent refractive index of the waveguide.

12. The element according to claim 1, wherein the waveguide has a structure for resonating the electromagnetic wave in the waveguide.

13. The element according to claim 1, wherein impedance mismatch occurs at an interface between the waveguide and the impedance matching portion.

14. The element according to claim 1,
wherein the impedance matching portion includes a microstrip line, and
wherein the waveguide element has a structure for adjusting an impedance of the impedance matching portion by a line width of the microstrip line and a film thickness of a dielectric layer sandwiched between the microstrip line and the ground conductor.

15. The element according to claim 1, wherein the waveguide, the resonance antenna and the impedance matching portion are formed on a substrate by planar integration.

16. The element according to claim 1, wherein the impedance matching portion has a $\lambda/4$ matching circuit.

17. The element according to claim 1, wherein the impedance matching portion has a structure for a coupled feed.

18. The element according to claim 1, wherein the resonance antenna has a first conductor, a second conductor and a dielectric arranged between the first conductor and the second conductor.

19. The element according to claim 18, wherein the impedance matching portion has the structure in which a notch is formed in the first conductor, and the waveguide is connected apart from the first conductor.

20. The element according to claim 18, wherein the impedance matching portion has a structure in which a portion of the waveguide is arranged between first conductor and the second conductor.

21. An element, comprising:
a waveguide having a first conductor layer, a second conductor layer and a core layer arranged between the first conductor layer and the second conductor layer;
a resonance antenna having a first conductor, a second conductor and a dielectric arranged between the first conductor and the second conductor, wherein the resonance antenna is arranged on an edge surface of the waveguide in a propagation direction of an electromagnetic wave in the waveguide; and
an impedance matching portion arranged between the waveguide and the resonance antenna,
wherein the second conductor layer and the second conductor are arranged in a row in the propagation direction so as to come in contact each other.

22. The element according to claim 21, wherein the first conductor layer and the first conductor are arranged in a row in the propagation direction; and
the first conductor layer is connected to the first conductor so as to come in contact with each other or via the conductor.

* * * * *